US011393882B2

United States Patent
Chen

(10) Patent No.: US 11,393,882 B2
(45) Date of Patent: Jul. 19, 2022

(54) TOUCH ELECTRODE CONFIGURATION FOR ORGANIC LIGHT-EMITTING DISPLAY PANEL

(71) Applicants: WUHAN TIANMA MICROELECTRONICS CO., LTD., Wuhan (CN); WUHAN TIANMA MICROELECTRONICS CO., LTD. SHANGHAI BRANCH, Shanghai (CN)

(72) Inventor: Min Chen, Shanghai (CN)

(73) Assignees: WUHAN TIANMA MICRO ELECTRONICS CO., LTD., Wuhan (CN); WUHAN TIANMA MICROELECTRONICS CO., LTD. SHANGHAI BRANCH, Shanghai (CN)

( * ) Notice: Subject to any disclaimer, the term of this patent is extended or adjusted under 35 U.S.C. 154(b) by 0 days.

(21) Appl. No.: 16/460,279

(22) Filed: Jul. 2, 2019

(65) Prior Publication Data
US 2020/0185458 A1      Jun. 11, 2020

(30) Foreign Application Priority Data
Dec. 6, 2018   (CN) .......................... 201811486457.2

(51) Int. Cl.
*H01L 27/32*      (2006.01)
*G06F 3/041*      (2006.01)

(52) U.S. Cl.
CPC ............ *H01L 27/323* (2013.01); *G06F 3/041* (2013.01)

(58) Field of Classification Search
None
See application file for complete search history.

(56) References Cited

U.S. PATENT DOCUMENTS

2015/0277606 A1* 10/2015 Kim ...................... G06F 3/0446
                                                       345/174
2016/0004372 A1*  1/2016 Nakajima ............. G06F 3/0446
                                                       345/174
(Continued)

FOREIGN PATENT DOCUMENTS

CN         105094479 A       11/2015
CN         106775066 A        5/2017

OTHER PUBLICATIONS

Chinese Office Action dated Aug. 23, 2021 for corresponding CN Application No. 201811486457.2, and English translation thereof.

*Primary Examiner* — Erik Kielin
(74) *Attorney, Agent, or Firm* — Tarolli, Sundheim, Covell & Tummino LLP

(57) ABSTRACT

An organic light-emitting display panel and a display device are provided. The organic light-emitting display panel includes: a plurality of touch electrodes extending in a first direction and arranged in a second direction; and a plurality of first leads one-to-one corresponding to the plurality of touch electrodes. The first leads are made of a transparent conductive material. The first leads are located in a different layer from the touch electrodes. An insulation layer is disposed between the film layers where the first leads and the touch electrodes are located. Each first lead at least partially overlaps with a corresponding touch electrode in a direction perpendicular to a plane of the organic light-emitting display panel, and is electrically connected to the corresponding touch electrode through a through hole in the insulation layer. The first lead extends in the first direction and is arranged in the second direction.

12 Claims, 16 Drawing Sheets

(56) References Cited

U.S. PATENT DOCUMENTS

| | | | | |
|---|---|---|---|---|
| 2016/0378224 A1* | 12/2016 | Kwon | ................... | H01L 27/322 |
| | | | | 345/174 |
| 2017/0123253 A1* | 5/2017 | Sugita | ................ | G02F 1/13338 |
| 2018/0314104 A1* | 11/2018 | Higano | ............... | G02F 1/13338 |
| 2019/0179467 A1* | 6/2019 | Kim | ...................... | H01L 27/323 |
| 2020/0081580 A1* | 3/2020 | Kim | ..................... | G06F 3/0448 |
| 2020/0249793 A1* | 8/2020 | Xu | ....................... | G06F 3/0445 |

* cited by examiner

TOUCH ELECTRODE CONFIGURATION FOR ORGANIC LIGHT-EMITTING DISPLAY PANEL

CROSS-REFERENCE TO RELATED APPLICATIONS

The present disclosure claims priority to Chinese Patent Application No. 201811486457.2, filed on Dec. 6, 2018, the content of which is incorporated herein by reference in its entirety.

TECHNICAL FIELD

The present disclosure relates to the field of display technologies, and, particularly, relates to an organic light-emitting display panel and a display device.

BACKGROUND

At present, display technologies have been applied to various aspects of people's daily life, and accordingly, more and more materials and technologies have been used for display screens. Nowadays, mainstream display screens mainly include liquid crystal display screens and organic light-emitting display panels. Compared with the liquid crystal display screens, the organic light-emitting display panels omit the most energy-consuming backlight module due to their self-luminous performance and thus are more energy-saving.

The organic light-emitting display panel generally has a touch electrode disposed in the display region, and the touch electrode is electrically connected to the driving chip in the lower side region of the display panel through a metal lead in the border region of the display panel. However, with the development of the display technologies, there is a higher requirement for the screen-to-body ratio of the display panel, i.e., reducing the area of the border region of the display panel. However, the existing touch electrode lead may occupy a relatively large space of the border region, which is not conducive to realization of a narrow border.

SUMMARY

In view of this, the present disclosure provides an organic light-emitting display panel and a display device, which can effectively reduce the touch electrode lead's space occupation of the border region, and facilitate realization of a narrow border.

In an aspect, the present provides an organic light-emitting display panel, and the organic light-emitting display panel includes: a plurality of touch electrodes extending in a first direction and arranged in a second direction; a plurality of first leads one-to-one corresponding to the plurality of touch electrodes, wherein the plurality of first leads extends in the first direction and is arranged in the second direction, each of the plurality of first leads is made of a transparent conductive material, and the plurality of first leads is located in a different layer from the plurality of touch electrodes; and an insulation layer disposed between a film layer where the plurality of first leads is located and a film layer where the plurality of touch electrodes is located. In a direction perpendicular to a plane of the organic light-emitting display panel, each of the plurality of first leads at least partially overlaps a corresponding touch electrode of the plurality of touch electrodes and is electrically connected to the corresponding touch electrode through a through hole in the insulation layer.

In another aspect, the present disclosure provides a display device, and the display device includes the above-mentioned organic light-emitting display panel.

BRIEF DESCRIPTION OF DRAWINGS

In order to more clearly explain the embodiments of the present disclosure or the technical solution in the related art, the drawings used in the description of the embodiments and the related art will be briefly described below. The drawings in the following description are some embodiments of the present disclosure. For those skilled in the art, other drawings may also be obtained based on these drawings without paying any creative labor.

DESCRIPTION OF EMBODIMENTS

In order to better understand objectives, technical solutions and advantages of embodiments of the present disclosure, the solutions of the embodiments of the present disclosure are described below in detail with reference to the drawings. The described embodiments are part of the embodiments of the present disclosure rather than all of the embodiments. All other embodiments obtained by those skilled in the art without paying creative labor shall fall into the protection scope of the present disclosure.

The terms used in the embodiments of the present disclosure are merely for the purpose of describing specific embodiments, rather than limiting the present disclosure. The terms "a", "an", "the" and "said" in a singular form in the embodiments of the present disclosure and the attached claims are also intended to include plural forms thereof, unless noted otherwise.

Figure 1:
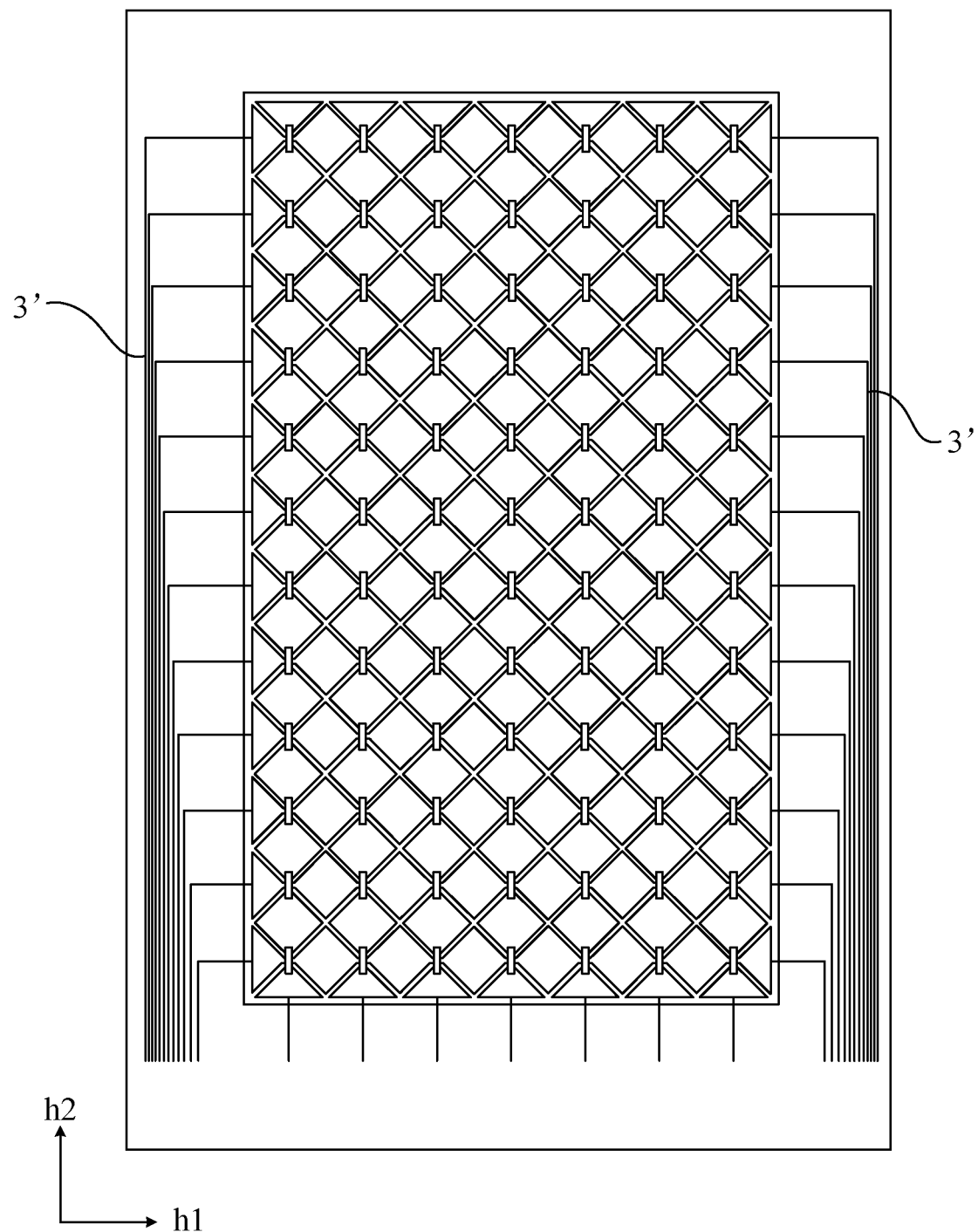
FIG. 1 is a structural schematic diagram showing an organic light-emitting display panel in the related art.
Figure 2:
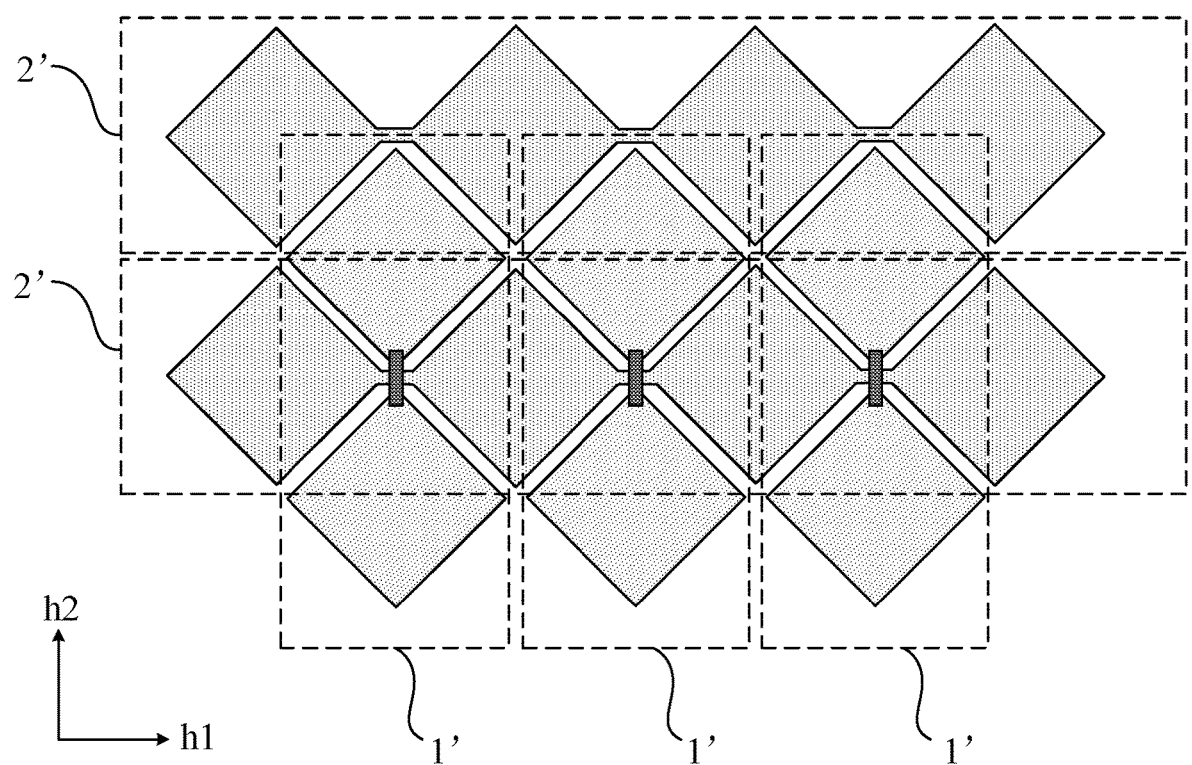
FIG. 2 is a partially enlarged schematic diagram showing a region in FIG. 1.

In order to more clearly explain the effects of the embodiments of the present disclosure, prior to introduction of the embodiments of the present disclosure, problems of the related art are firstly introduced. The inventor of the present disclosure has conducted intensive studies and found that in the existing organic light emitting display panel, the leads for the touch electrodes occupy a relatively large space of the border region. FIG. 1 is a structural schematic diagram showing an organic light-emitting display panel in the related art; and FIG. 2 is a partially enlarged schematic diagram showing a region in FIG. 1. As shown in FIGS. 1-2, the display panel includes a plurality of first electrodes 1' arranged in a first direction h1 and extending in a second direction h2, and a plurality of second electrodes 2' arranged in the second direction h2 and extending in the first direction h1. The plurality of first electrodes 1' is driving electrodes and the plurality of second electrodes 2' is sensing electrodes. Or, the plurality of first electrodes 1' is sensing electrodes and the plurality of second electrodes 2' is driving electrodes. In order to ensure the touch effect of the touch electrode, the first electrodes 1' or the second electrodes 2' are generally used as double-end electrodes, so that the attenuation and delay of signal transmission on the touch electrode can be reduced, and a signal difference between two ends of the touch electrode can be reduced, thereby improving the touch performance. For example, the structure illustrated in FIG. 1 is exemplified by using the second electrodes 2' as double-end driving electrodes. The two ends of each of the second electrodes 2' are electrically connected to the driving chip in the lower portion of the display panel through a metal lead 3'. As a result, there is a large number of metal leads 3' in the border region. In order to achieve a narrow border, on the one hand, if the spacing between the metal leads 3' is reduced, signal crosstalk easily occurs between different metal leads 3'; and on the other hand, if the line width of the metal lead 3' is reduced, the impedance of the metal lead 3' may be increased and a large signal attenuation will be caused, adversely affecting the touch performance.

Figure 3:
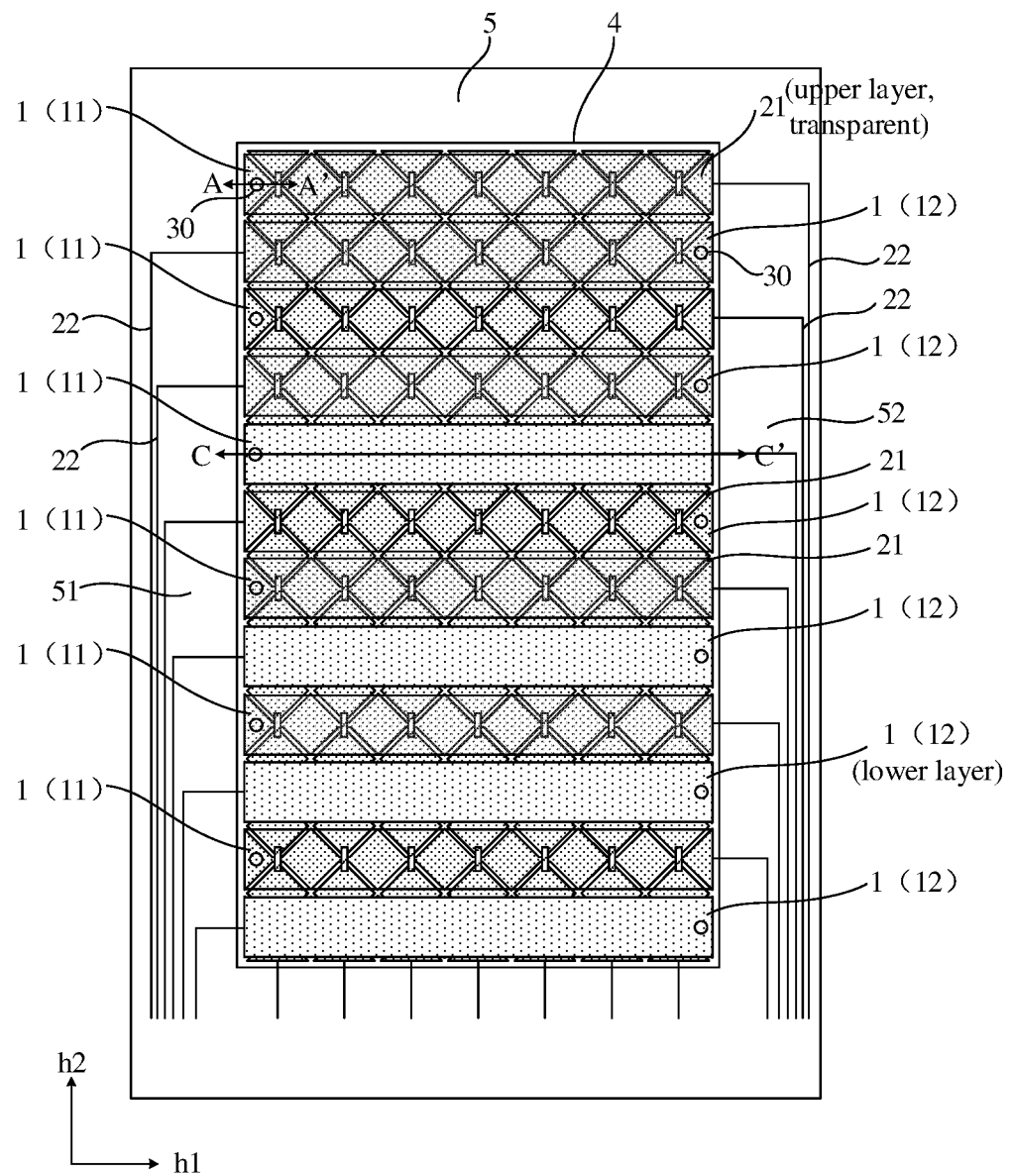
FIG. 3 is a structural schematic diagram showing an organic light-emitting display panel according to an embodiment of the present disclosure.
Figure 4:
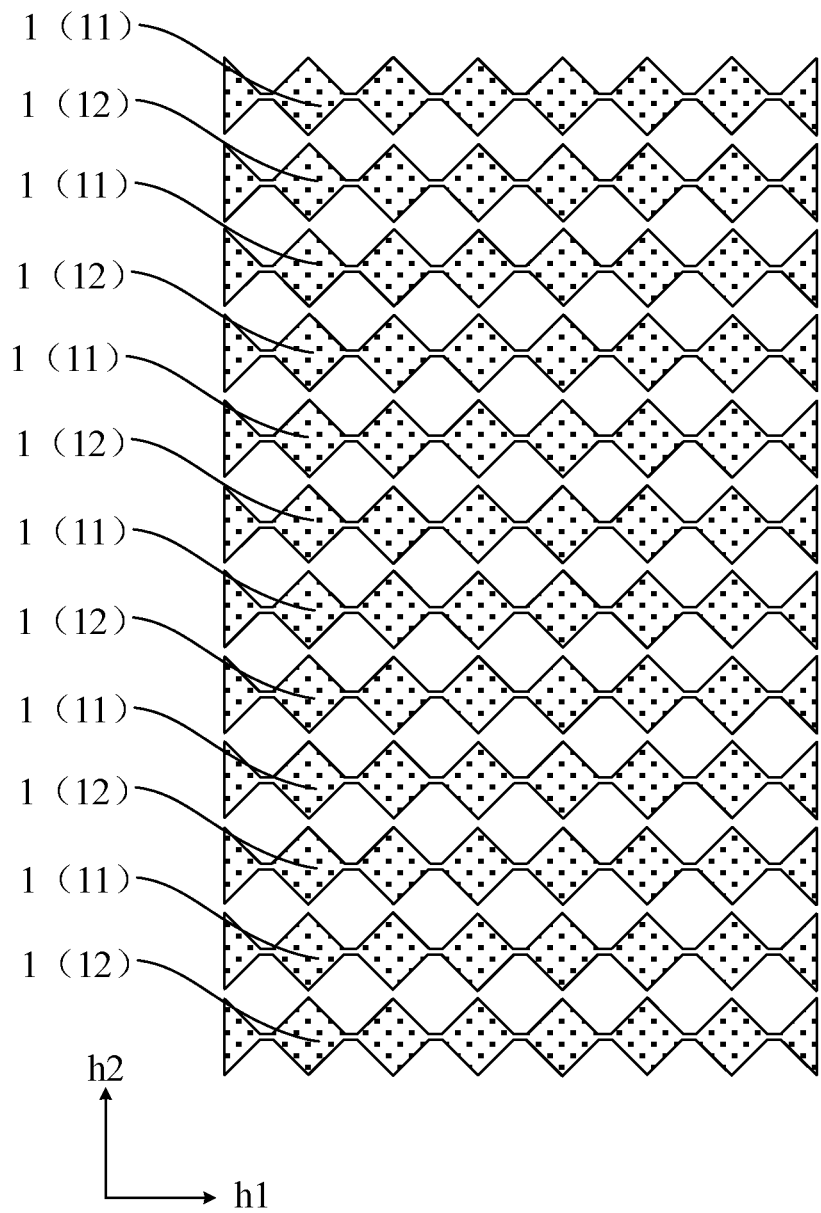
FIG. 4 is a structural schematic diagram showing a plurality of touch electrodes 1 in FIG. 3.
Figure 5:
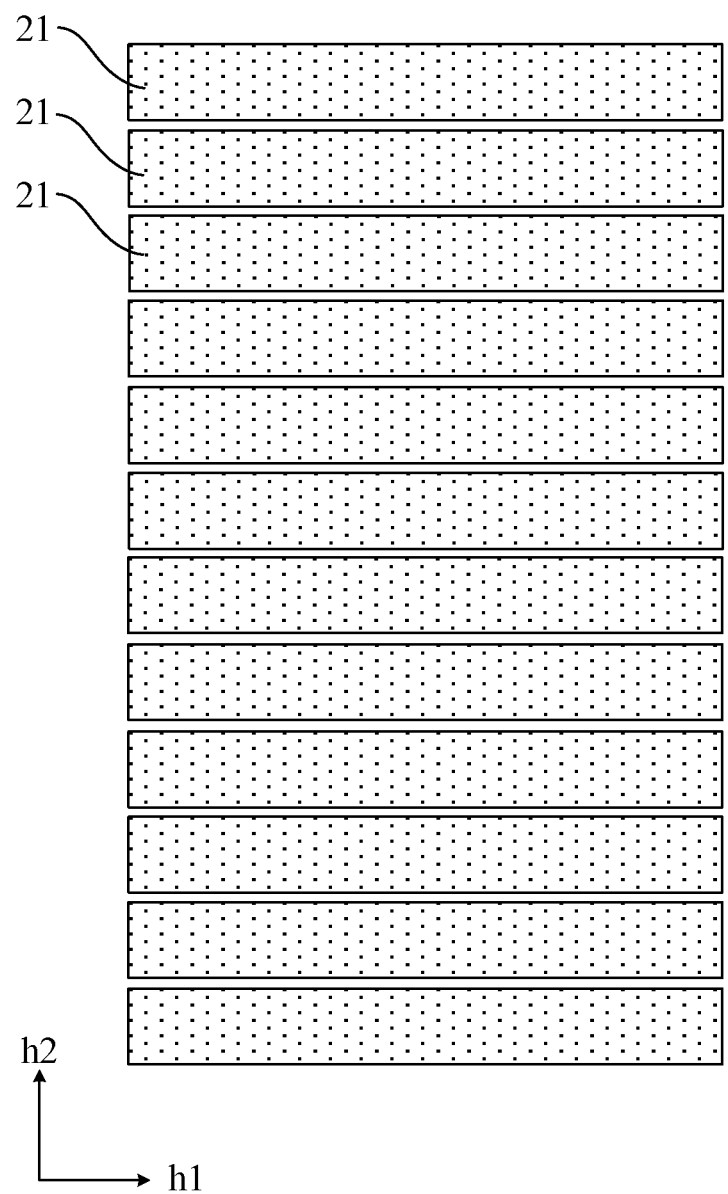
FIG. 5 is a structural schematic diagram showing the first lead in FIG. 3.
Figure 6:
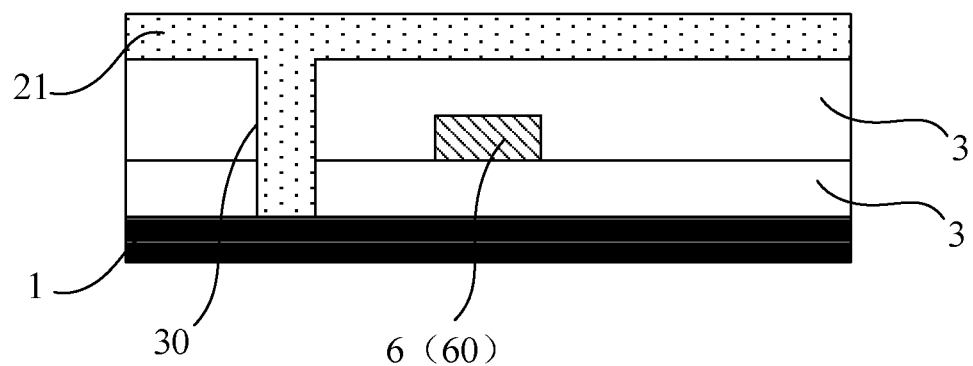
FIG. 6 is a schematic cross-sectional view taken along line AA' in FIG. 3.
Figure 7:
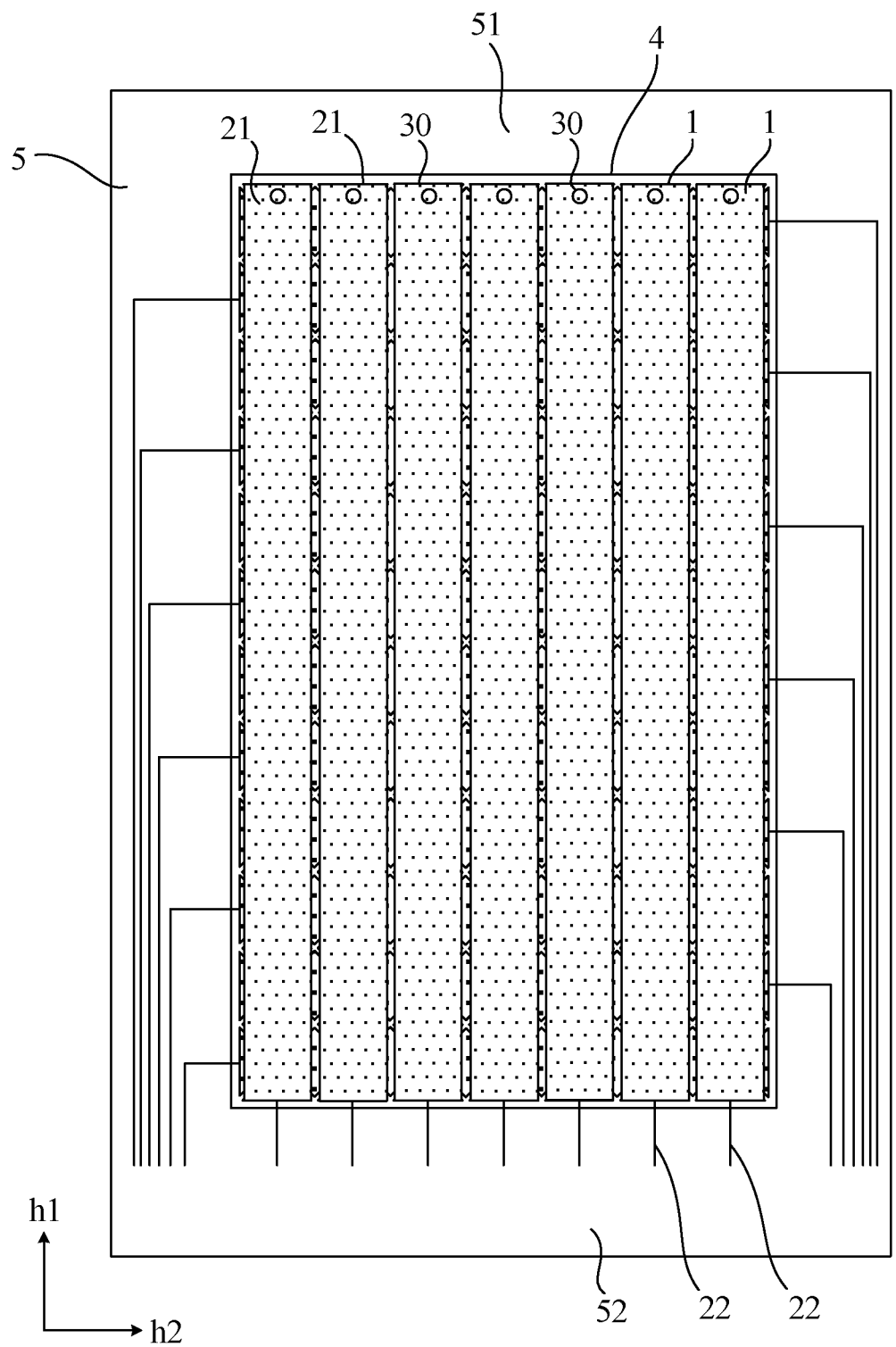
FIG. 7 is a structural schematic diagram showing an organic light-emitting display panel according to another embodiment of the present disclosure.
Figure 8:
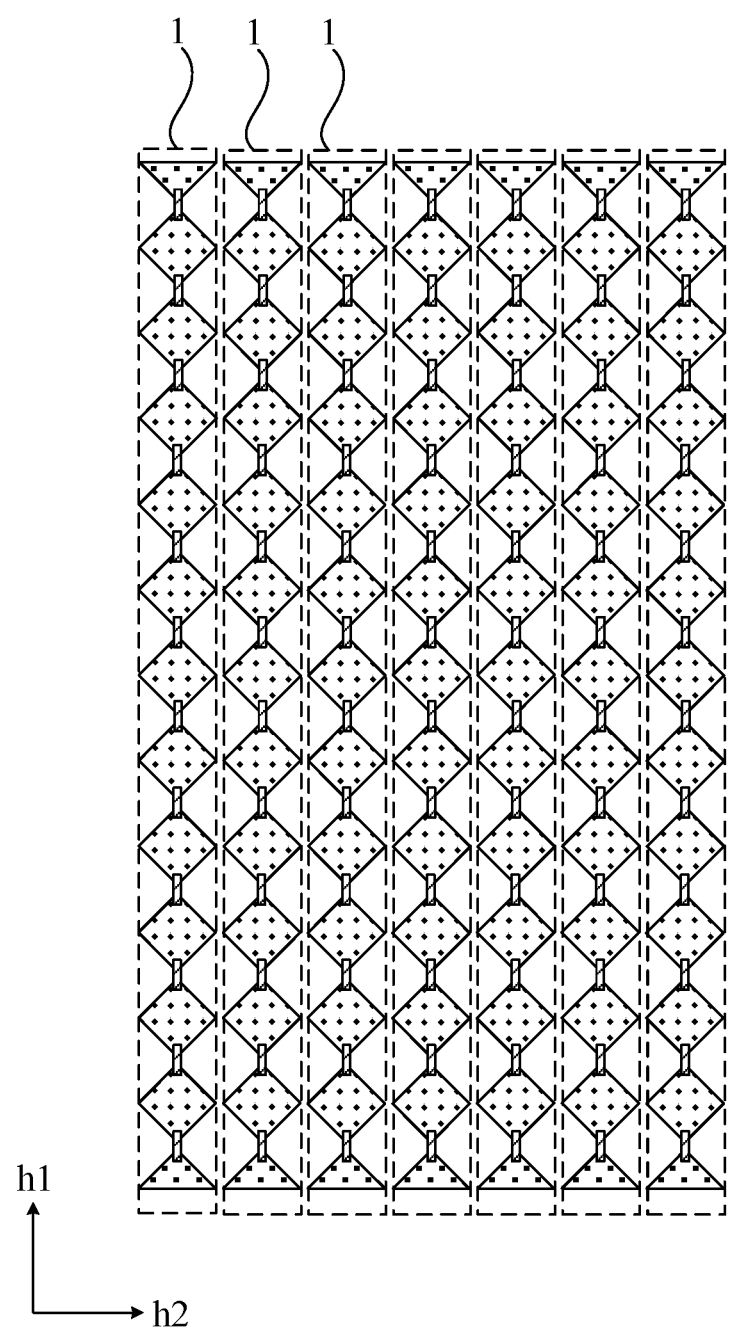
FIG. 8 is a structural schematic diagram showing a plurality of touch electrodes 1 in FIG. 7.
Figure 9:
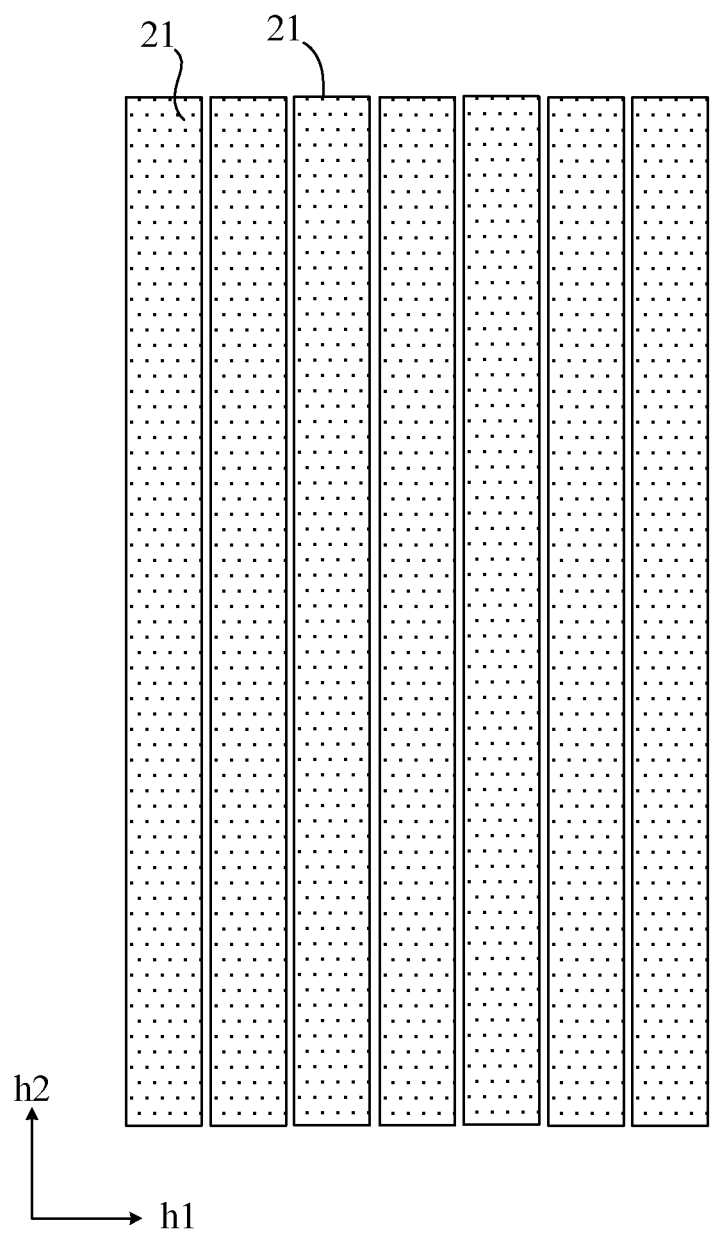
FIG. 9 is a structural schematic diagram showing the first lead in FIG. 7.

FIG. 3 is a structural schematic diagram showing an organic light-emitting display panel according to an embodiment of the present disclosure; FIG. 4 is a structural schematic diagram showing a plurality of touch electrodes 1 in FIG. 3; FIG. 5 is a structural schematic diagram showing the first lead in FIG. 3; FIG. 6 is a schematic cross-sectional view taken along direction AA' in FIG. 3; FIG. 7 is a structural schematic diagram showing an organic light-emitting display panel according to another embodiment of the present disclosure; FIG. 8 is a structural schematic diagram showing a plurality of touch electrodes 1 in FIG. 7; and FIG. 9 is a structural schematic diagram showing the first lead in FIG. 7. With reference to FIGS. 3-9, the present disclosure provides an organic light-emitting display panel, including: a plurality of touch electrodes 1 extending in a first direction h1 and arranged in a second direction h2; and a plurality of first leads 21 one-to-one corresponding to the plurality of touch electrodes 1. The first leads 21 are made of a transparent conductive material. The first leads 21 are located in a different layer from the touch electrodes 1. An insulation layer 3 is disposed between the film layer where the first leads 21 are located and the layer where the touch electrodes 1 are located. Each first lead 21 at least partially overlaps with the corresponding touch electrode 1 in a direction perpendicular to a plane of the organic light-emitting display panel. Each first lead 21 is electrically connected to the corresponding touch electrode 1 through a through hole 30 in the insulation layer 3. The plurality of first leads 21 extends in the first direction h1 and is arranged in the second direction h2.

Specifically, each first lead 21 made of the transparent conductive material is used as at least a section of the lead connecting the corresponding touch electrode 1 to the driving chip, so that the first lead 21 can be directly disposed in the display region to replace a section of the lead originally required to be disposed in the border region, and the touch electrode lead's space occupation of the border region can be effectively reduced, thereby facilitating the realization of a narrow border.

In an embodiment of the present disclosure, one end of each of the plurality of touch electrodes 1 in the extending direction thereof is electrically connected to the corresponding first lead 21, and the other end of the touch electrode 1 in the extending direction thereof is electrically connected to a second lead 22.

Taking the uppermost touch electrode 1 in FIG. 3 for example, the touch electrode 1 extends along the first direction h1. The leftmost end of the touch electrode 1 is electrically connected to the corresponding first lead 21, i.e., the uppermost first lead 21, through a through hole 30. The rightmost end of the touch electrode 1 is electrically connected to the second lead 22. The second lead 22 is configured to electrically connect the rightmost end of the touch electrode 1 to the driving chip, while the first lead 21 is configured to electrically connect the leftmost end of the touch electrode 1 to the driving chip. In this way, the touch electrode 1 is used as a double-end driving electrode to improve the touch performance of the touch electrode 1.

In an embodiment of the present disclosure, the display panel further includes a plurality of second leads one-to-one corresponding to the plurality of first leads 21; and each of the plurality of touch electrodes 1 is electrically connected to one end of a corresponding first lead 21, and the other end of the first lead 21 is electrically connected to a corresponding second lead 22.

For example, the expression "the other end of the first lead 21 is electrically connected to a corresponding second leads 22" means that a first end of the first lead 21 is electrically connected to a first end of the corresponding touch electrode 1, and a second end of the first lead 21 is electrically connected to the corresponding second lead 22 which is further electrically connected to a second end of the corresponding touch electrode 1. As shown in FIG. 3, the leftmost end of the uppermost first lead 21 is electrically connected to the leftmost end of the touch electrode 1, and both the rightmost ends of the uppermost first lead 21 and the touch electrode 1 are electrically connected to a same second lead 22. In this way, the second lead 22 can extend in the border region to the driving chip, one end of the touch electrode 1 is directly connected to the driving chip through the second lead 22, and the other end of the touch electrode 1 is electrically connected to the second lead 22 through the first lead 21, so that both of the two ends of the touch electrode 1 are electrically connected to the driving chip to realize double-end driving. However, it is not necessary to provide separate leads on the two ends of the touch electrode 1 as in the related art, and only one second lead 22 arranged in the border region is enough to realize the double-end driving of the touch electrode 1, thereby effectively reducing the touch lead's space occupation of the border region under the premise of ensuring the touch performance of the touch electrode 1.

In an embodiment of the present disclosure, the organic light-emitting display panel includes a display region 4 and a non-display region 5. In the first direction h1, each touch electrode 1 and each first lead 21 extend from one end of the display region 4 to the other end of the display region 4. The second leads are located in the non-display region 5, and the non-display region 5 is the border region.

In an embodiment of the present disclosure, as shown in FIG. 7, in the first direction h1, the non-display region 5 includes a first region 51 and a second region 52, and the first region 51 and the second region 52 are located at two opposite sides of the display region 4, respectively. Each touch electrode 1 is electrically connected to the corresponding first leads 21 at a position, adjacent to the first region 51, in the display region 4. Each touch electrode 1 is electrically connected to the corresponding second lead 22 at a position in the second region 52. In the structure shown in FIG. 7, the uppermost end of each touch electrode 1 is electrically connected to the uppermost end of the corresponding first lead 21. The lowermost ends of each touch electrode 1 and the corresponding first lead 21 are electrically connected to the corresponding second lead 22. The driving chip (not shown) can be disposed in the second region 52 at the bottom of the display panel. In this way, the second lead 22 can be electrically connected to the driving chip directly at a position in the second region 52.

In an embodiment of the present disclosure, as shown in FIGS. 3 and 4, in the first direction h1, the non-display region 5 includes a first region 51 and a second region 52, and the first region 51 and the second region 52 are located at two opposite sides of the display region 4, respectively. The plurality of touch electrodes 1 includes a plurality of first touch electrodes 11 and a plurality of second touch electrodes 12. Each of the plurality of first touch electrodes 11 and each of the plurality of second touch electrodes 12 are alternately arranged in the second direction h2. Each first touch electrode 11 is electrically connected to the corresponding first lead 21 at a position, adjacent to the first region 51, in a display region 4, and is electrically connected to the corresponding second lead 22 at a position in the second region 52. Each second touch electrode 12 is electrically connected to the corresponding first lead 21 at a position, adjacent to the second region 52, in a display region 4, and is electrically connected to the corresponding second lead 22 at a position in the first region 51.

Specifically, in the structure shown in FIG. 3, the first region 51 is located at the left side of the display region 4, the second region 52 is located at the right side of the display region 4, and the driving chip (not shown) may be disposed under the display region 4. In the second direction h2, one second touch electrode 12 is disposed between any two adjacent first touch electrodes 11, and one first touch electrode 11 is disposed between any two adjacent second touch electrodes 12. The rightmost end of the first touch electrode 11 is electrically connected to a corresponding second lead 22, and a part of the second lead 22 extends in the second region 52 and is electrically connected the driving chip under the display region 4. The leftmost end of the second touch electrode 12 is electrically connected to a corresponding second lead 22, and a part of the second lead 22 extends in the first region 51 and is electrically connected to the driving chip under the display region 4. In this way, all of the second leads 22 are divided into two groups which respectively extend from the left and right sides of the display region 4 to the driving chip, so that the space of the non-display region 5 occupied by the second leads 22 at the left side of the display region 4 is equal to the space of the non-display region 5 occupied by the second leads 22 at the right side of the display region 4.

Figure 10:
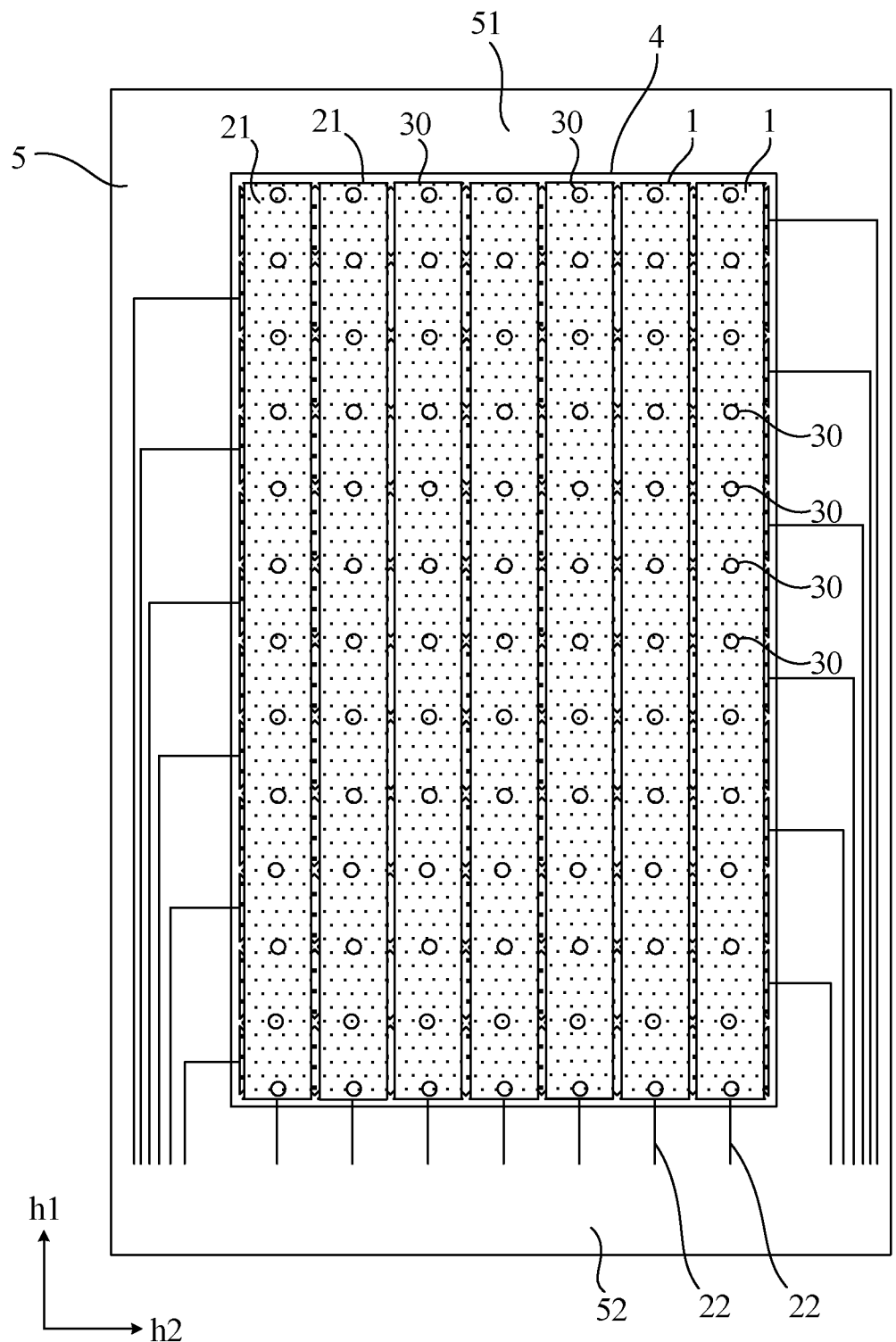
FIG. 10 is a structural schematic diagram showing an organic light-emitting display panel according to yet another embodiment of the present disclosure.

FIG. 10 is a structural schematic diagram showing an organic light-emitting display panel according to yet another embodiment of the present disclosure. As shown in FIG. 10, each first lead 21 is electrically connected to the corresponding touch electrode 1 through a plurality of through holes 30 in the insulation layer.

Specifically, the touch electrode 1 is not only electrically connected at one end in the extending direction thereof to the first lead 21 through one through hole, but also can be further electrically connected to the first lead 21 through a plurality of through holes in the extending direction thereof, in order to further ensure the electrical connection effect between the touch electrode 1 and the first lead 21. For example, in the structure shown in FIG. 10, the touch electrode 1 is electrically connected to the corresponding first lead 21 through a plurality of through holes 30 uniformly distributed in the extending direction of the touch electrode 1. In this way, the signal difference of the touch electrode 1 at different positions in the extending direction thereof can be reduced, thereby improving the touch performance.

Figure 11:
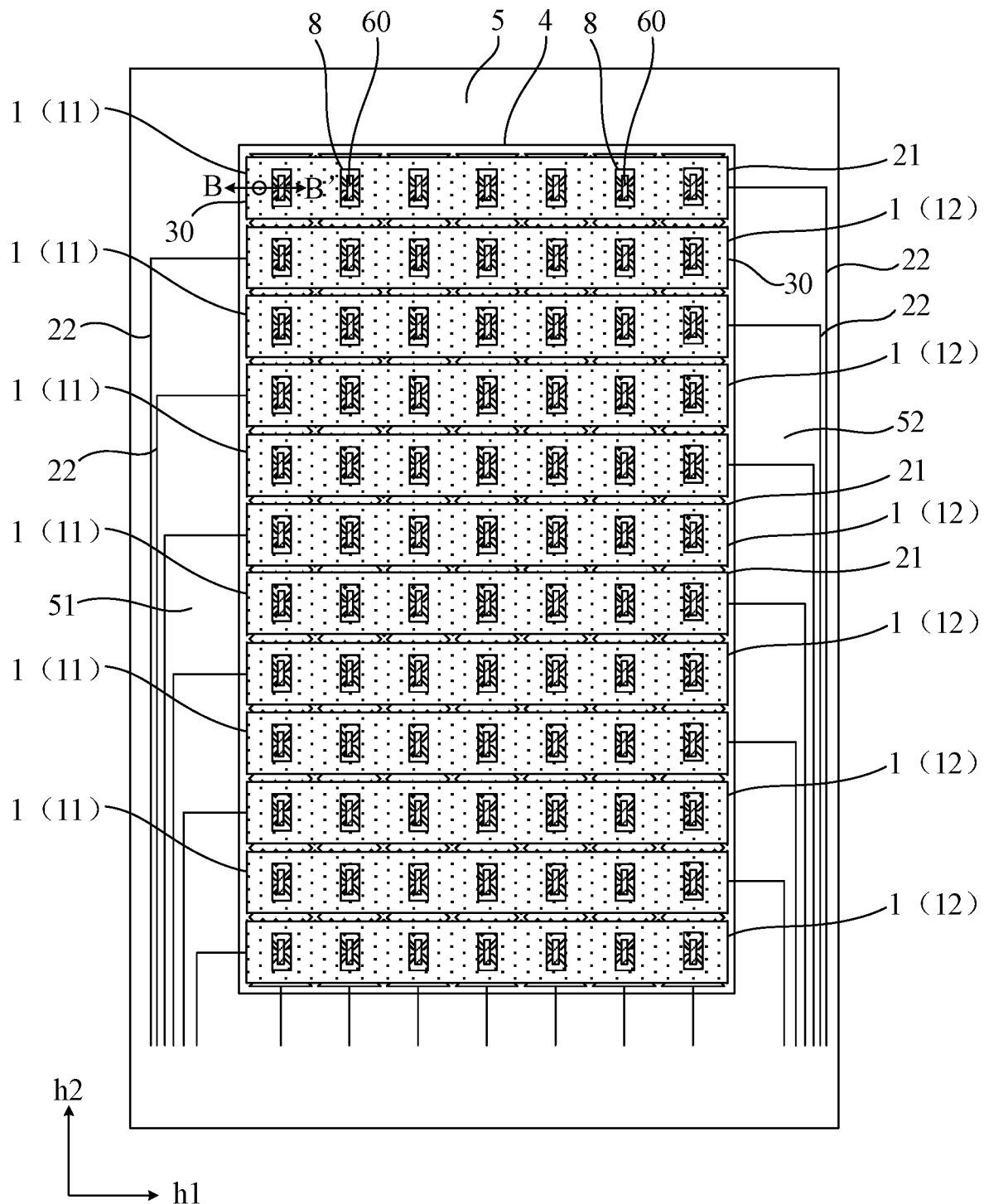
FIG. 11 is a structural schematic diagram showing an organic light-emitting display panel according to yet another embodiment of the present disclosure.
Figure 12:
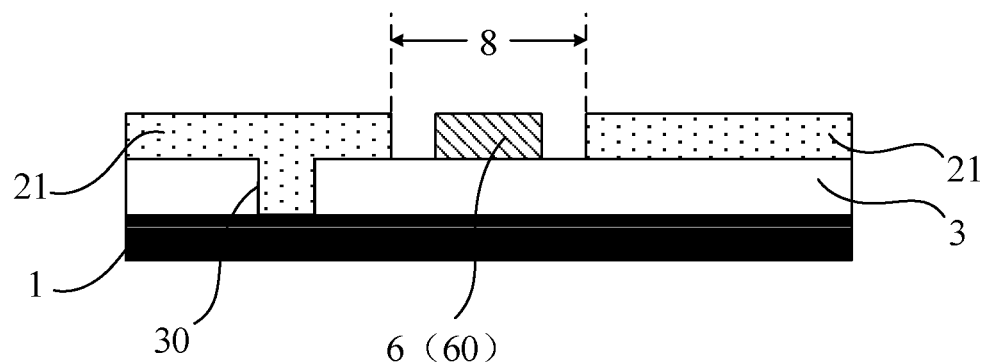
FIG. 12 is a cross-sectional structural view taken along direction BB' in FIG. 11.
Figure 13:
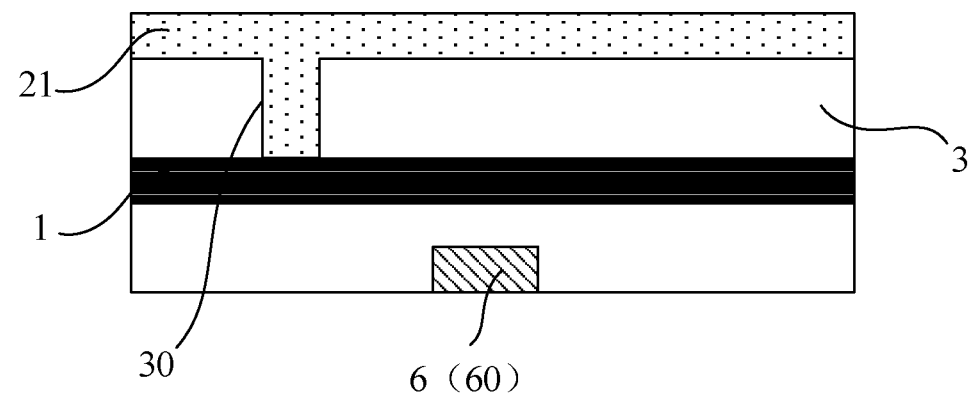
FIG. 13 is another cross-sectional structural view taken along direction AA' in FIG. 3.

In an embodiment of the present disclosure, as shown in FIG. 6, the organic light-emitting display panel further includes a bridge metal layer 6 located between the first lead 21 and the touch electrode 1. FIG. 11 is a structural schematic diagram showing an organic light-emitting display panel according to yet another embodiment of the present disclosure; and FIG. 12 is a cross-sectional structural view taken along direction BB' in FIG. 11. Alternatively, as shown in FIGS. 11 and 12, the bridge metal layer 6 and the first lead 21 are disposed in a same layer. FIG. 13 is another cross-sectional structural view taken along direction AA' in FIG. 3. Alternatively, as shown in FIG. 13, the bridge metal layer 6 is located at a side of the touch electrode 1 facing away from the first lead 21.

Figure 14:
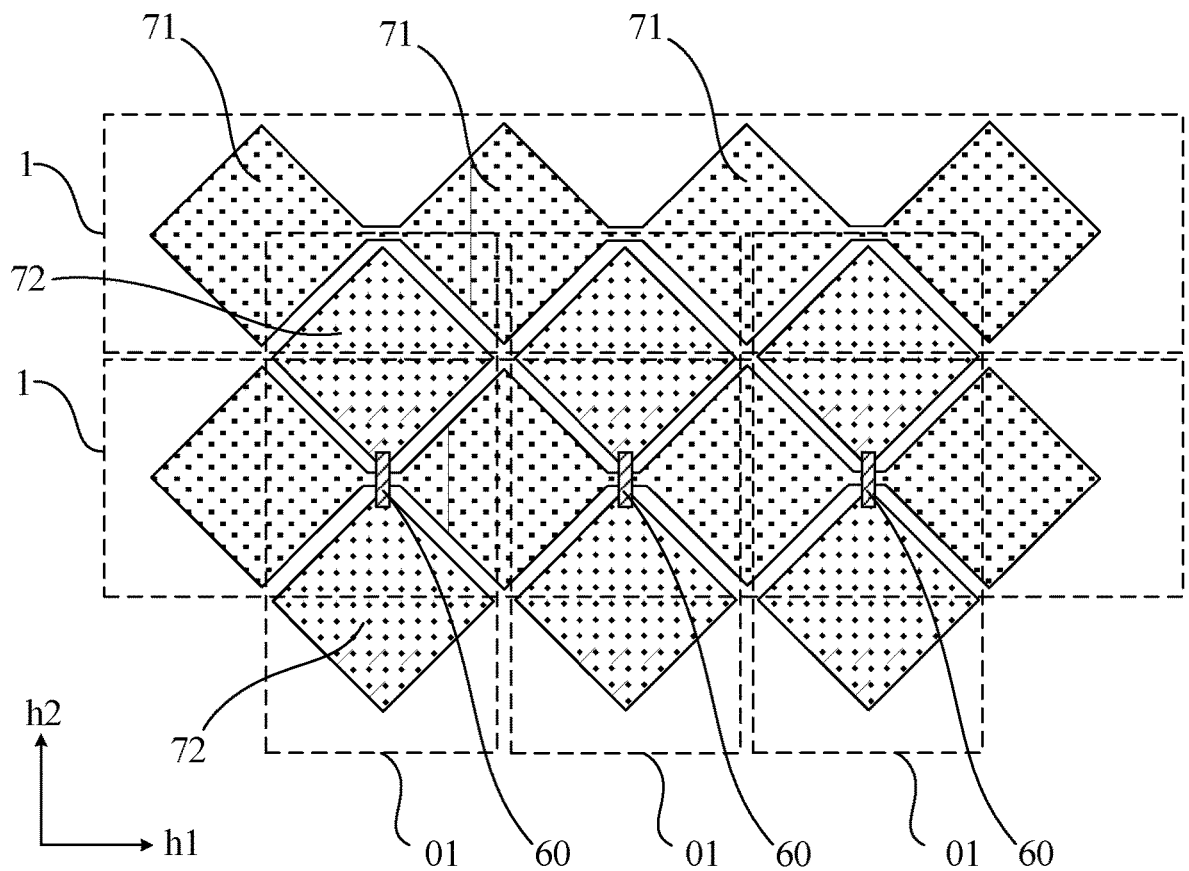
FIG. 14 is a partially enlarged structural schematic diagram showing a film layer where the touch electrode 1 in FIG. 3 is located.

Specifically, the bridge metal layer 6 is configured to form a bridge pattern. The bridge pattern is used to realize a bridge connection of the touch electrode block. In the organic light-emitting display panel, there are generally two types of touch electrodes, i.e., driving electrodes and sense electrodes, and the two types of touch electrodes are intersected with one another. However, when the two types of electrodes are fabricated in a same layer, in order to avoid electrical connection between the two types of electrodes, one type of them may be set as a plurality of independent touch electrode blocks which are then electrically connected with one another through bridge patterns in another layer. FIG. 14 is a partially enlarged structural schematic diagram showing a film layer where the touch electrode 1 in FIG. 3 is located. For example, as shown in FIG. 14, the driving electrodes are the touch electrodes 1. A plurality of touch electrodes 1 extends in the first direction h1 and are arranged in the second direction h2. A plurality of sense electrodes 01 extends in the second direction h2 and are arranged in the first direction h1. Each of the plurality of touch electrodes 1 includes a plurality of first rhombic electrode blocks 71 arranged in the first direction h1. Meanwhile, in a same touch electrode 1, any two adjacent first rhombic electrode blocks 71 are connected together by a material in a same layer where the first rhombic electrode blocks 71 are located. Each of the plurality of sense electrodes 01 includes a plurality of second rhombic electrode blocks 72 arranged in the second direction h2. Any two adjacent second rhombic electrode blocks 72 in a same sense electrode 01 are bridged by a bridge pattern 60. The first rhombic electrode blocks 71 and the second rhombic electrode blocks 72 are located in a same layer, while the bridge pattern 60 is located in an additional bridge metal layer 6. The two layers are arranged in an insulation manner. The two types of electrodes do not affect another other by means of bridge connection. Therefore, in order to prevent the first leads 21 from affecting the bridge metal layer 6, the three layer structure relationships as shown in FIGS. 6, 12 and 13 can be adopted. For example, in the structure shown in FIG. 6, the bridge metal layer 6 is located between the first lead 21 and the touch electrode 1, so that the first lead 21 will not affect the bridge connection between the film layer where the bridge patterns 60 are located and the film layer where the touch electrodes 1 are located; further, in order to avoid the influence of the bridge pattern 60 on the first lead 21, it is only required that the through hole 30 through which the first lead 21 is electrically connected to the touch electrode 1 avoid the position where the bridge pattern 60 is located. In the structure as shown in FIG. 12, the bridge metal layer 6 and the first lead 21 are arranged in a same layer, and therefore, it is only required that the bridge pattern 60 be insulated from the first lead 21 in order to avoid the influence of the bridge pattern 60 on the first lead 21. In the structure as shown in FIG. 13, the touch electrode 1 is located between the bridge metal layer 6 and the first lead 21, and thus the bridge connection between the film layer where the bridge pattern 60 is located and the film layer where the touch electrode 1 is located, and thus the electrical connection between the first lead 21 and the touch electrode 1 do not affect each other.

In an embodiment of the present disclosure, as shown in FIGS. 11 and 12, the bridge metal layer 6 and the first lead 21 are disposed in a same layer. The bridge metal layer 6 includes the bridge pattern 60. The first lead 21 has a hollow region 8. In a direction perpendicular to the plane of the organic light-emitting display panel, the bridge pattern 60 is located outside the first lead 21 or within the hollow region 8. In this way, on the one hand, the thickness of the display panel can be reduced; and on the other hand, the first lead 21 and the bridge patterns 60 will not affect each other.

Figure 15:
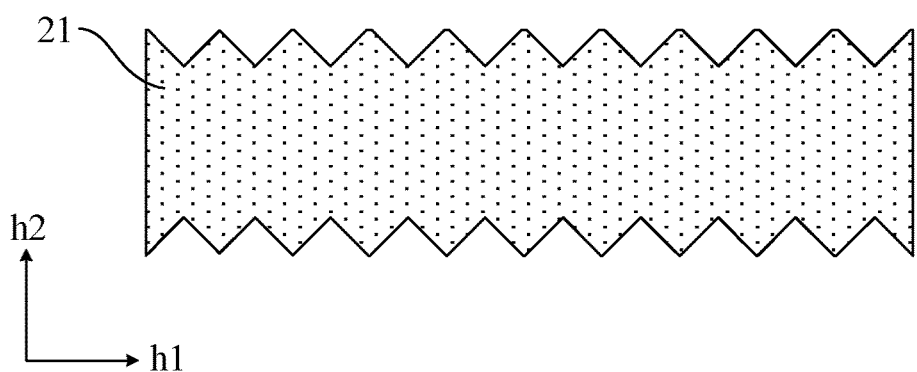
FIG. 15 is a partially enlarged schematic diagram showing a first lead according to an embodiment of the present disclosure.
Figure 16:
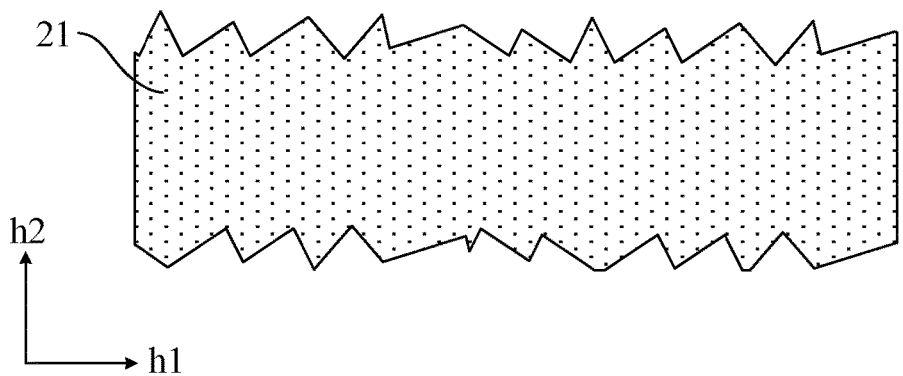
FIG. 16 is a partially enlarged schematic diagram showing a first lead according to another embodiment of the present disclosure.

FIG. 15 is a partially enlarged schematic diagram showing a first lead according to an embodiment of the present disclosure; and FIG. 16 is a partially enlarged schematic diagram showing a first lead according to another embodiment of the present disclosure. As shown in FIGS. 15 and 16, edges of each of the first leads 21 extending in the first direction h1 are serrated, e.g., edges with even teeth as shown in FIG. 15, or edges with uneven teeth as shown in FIG. 16. The serrated edges allow light to be reflected in different directions at the edges of the first lead 21, thereby reducing the display difference caused by the edges of the first lead 21 in the display region.

In an embodiment of the present disclosure, the first lead 21 is made of an indium tin oxide material.

Figure 17:
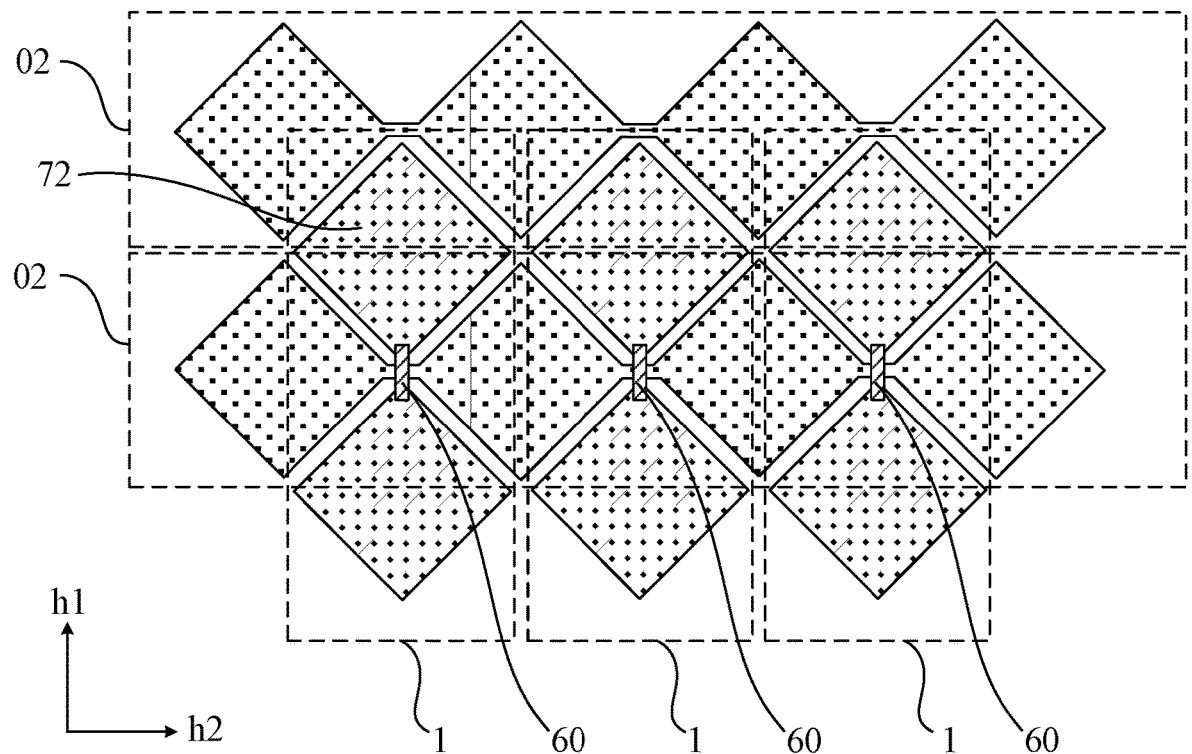
FIG. 17 is a partially enlarged structural schematic diagram showing a film layer where the touch electrode 1 in FIG. 7 is located.

In an embodiment of the present disclosure, as shown in FIG. 14, the touch electrodes 1 are driving electrodes, and the organic light-emitting display panel further includes sense electrodes 01. FIG. 17 is a partially enlarged structural schematic diagram showing a film layer where the touch electrodes 1 in FIG. 7 are located. Alternatively, as shown in FIG. 17, the touch electrodes 1 are sense electrodes, and the organic light-emitting display panel further includes driving electrodes 02.

Figure 18:
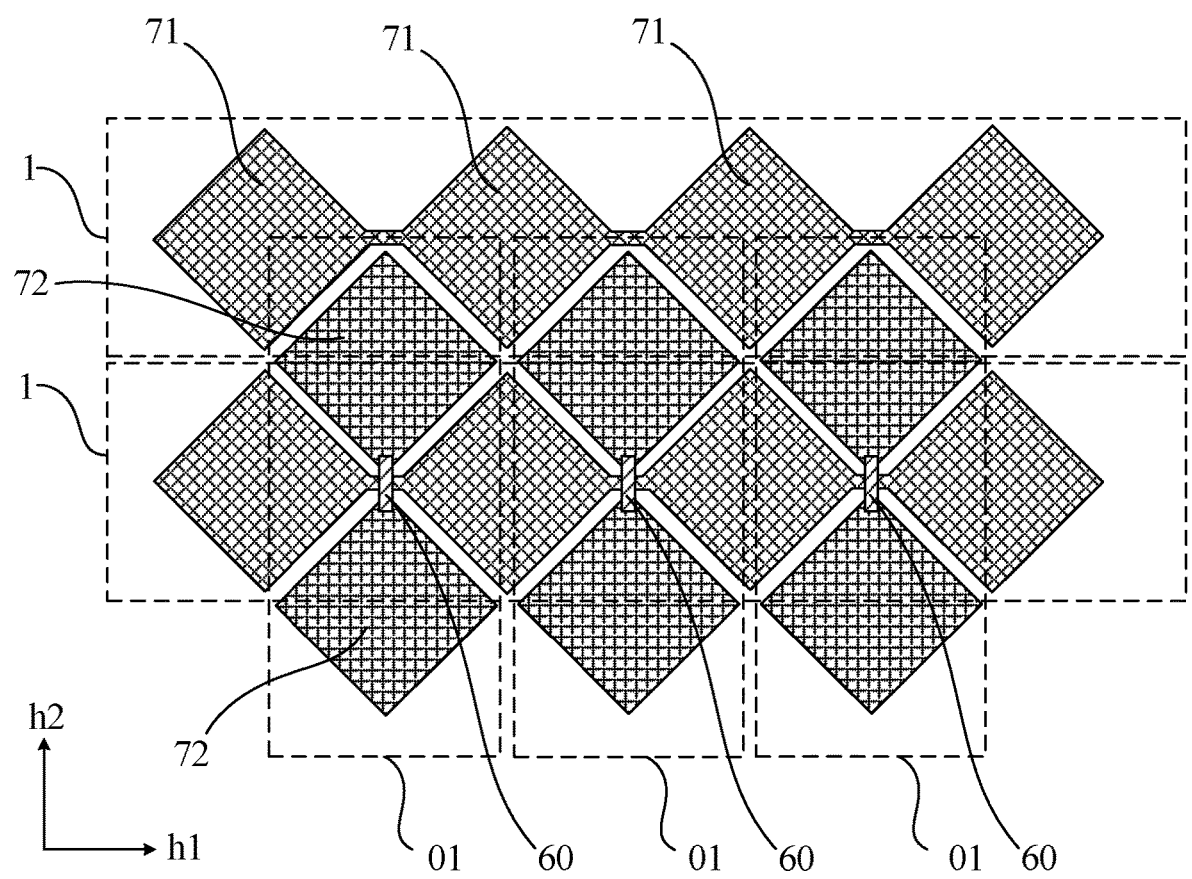
FIG. 18 is a partially enlarged structural schematic diagram showing a film layer where the touch electrode 1 in FIG. 3 is located.

In an embodiment of the present disclosure, the touch electrodes 1 are metal grids or a transparent conductive layer. FIG. 18 is a partially enlarged structural schematic diagram showing a film layer where the touch electrodes 1 in FIG. 3 are located. As shown in FIG. 18, the touch electrodes 1 are structured as metal grids.

Figure 19:
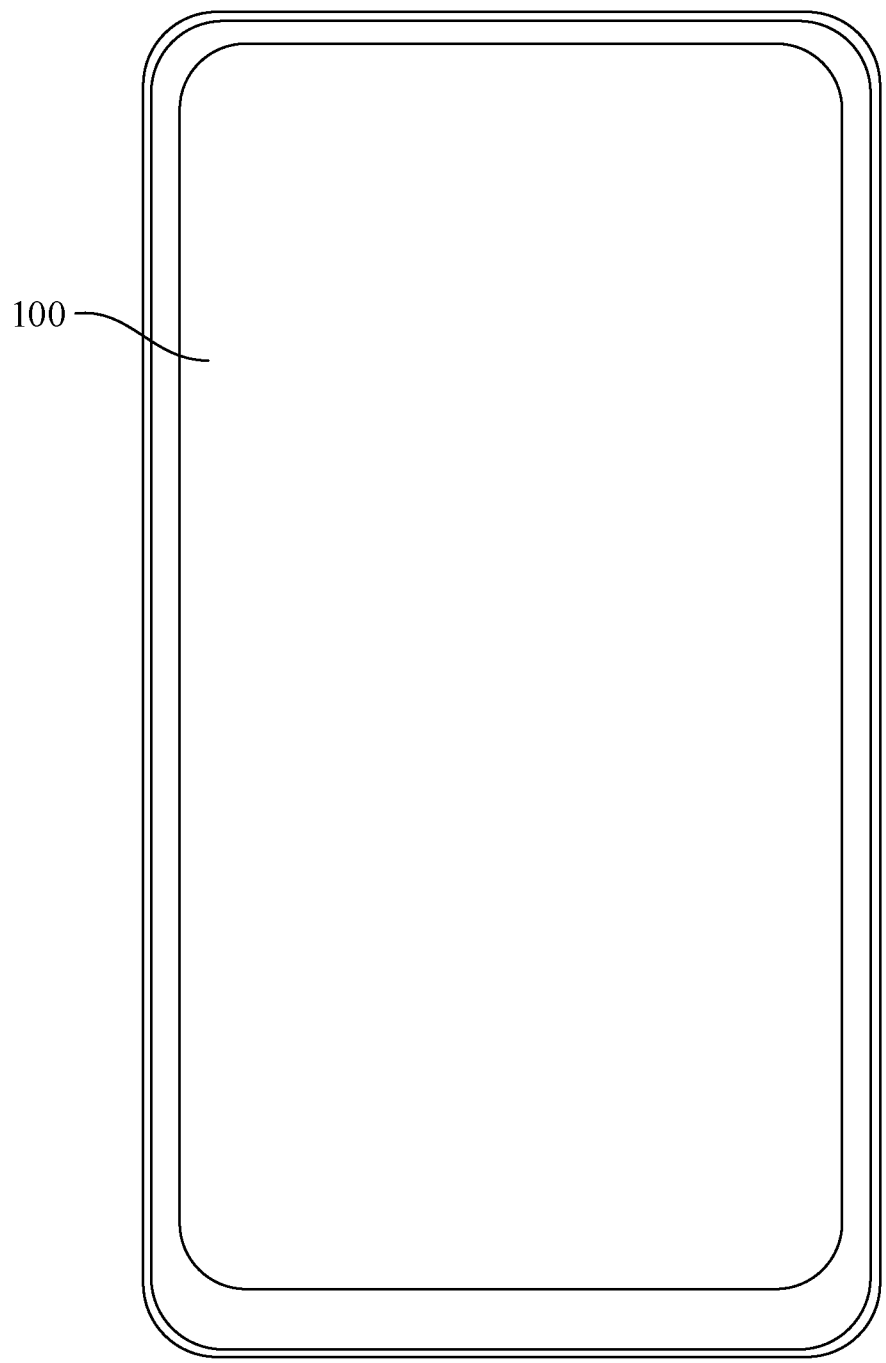
FIG. 19 is a structural schematic diagram showing a display device according to an embodiment of the present disclosure.
Figure 20:
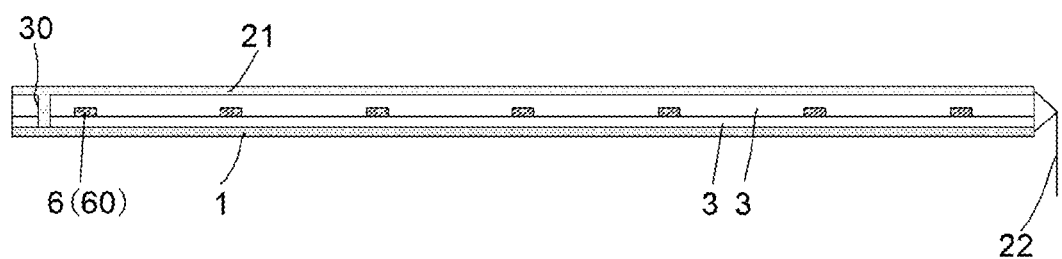
FIG. 20 is a schematic cross-sectional view taken along line CC' in FIG. 3.
Figure 21:
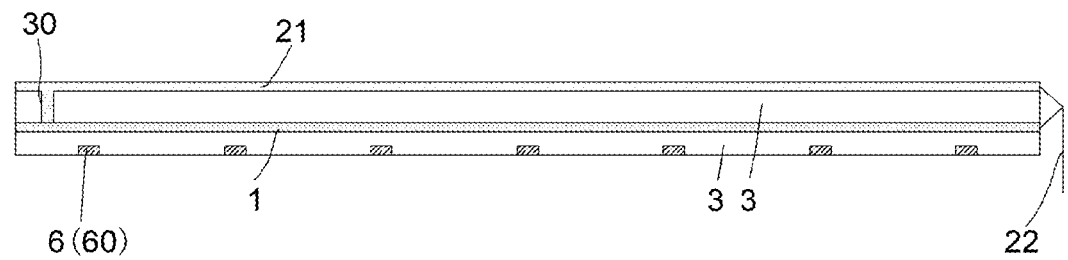
FIG. 21 is another schematic cross-sectional view taken along line CC' in FIG. 3.

FIG. 19 is a structural schematic diagram showing a display device according to an embodiment of the present disclosure. As shown in FIG. 19, the present disclosure provides a display device including the above-described organic light-emitting display panel 100.

Specifically, the specific structure and principle of the organic light-emitting display panel 100 are same as those in the foregoing embodiments, which are not elaborated herein. The display device may be any electronic device having a display function such as a mobile phone, a tablet computer, a laptop computer, an e-book, a television, and so on.

With the display device according to the embodiments of the present disclosure, the first lead 21 made of the transparent conductive material is used as at least a section of the lead connecting the touch electrode to the driving chip, so that the first lead 21 can be directly disposed in the display region, so as to replace a section of the lead originally required to be disposed in the border region. In this way, the touch electrode lead's space occupation of the border region can be effectively reduced, and therefore it is conducive to realizing a narrow border. Meanwhile, the first lead can be designed wider than the lead originally disposed in the border region, and can have a multi-point electrical connection with the touch electrode, which further reduces the signal attenuation of the touch electrode in the extending direction thereof and improves the touch performance of the touch electrode.

The above are merely preferred embodiments of the present disclosure, and as mentioned above, are not used to limit the present disclosure. Any modification, equivalent substitution, improvement, etc., made within the principles of the present disclosure, shall fall into the protection scope of the present disclosure

What is claimed is:

1. An organic light-emitting display panel, comprising:
   a plurality of first touch electrodes extending in a first direction and arranged in a second direction;
   a plurality of second touch electrodes extending in the second direction and arranged in the first direction;
   a plurality of first leads one-to-one corresponding to the plurality of first touch electrodes, wherein the plurality of first leads extends in the first direction and is arranged in the second direction, each of the plurality of first leads is made of a transparent conductive material, and the plurality of first leads is located above the plurality of first touch electrodes; each of the plurality of first leads is a continuous structure and has a first end and a second end in the first direction, each of the plurality of first touch electrodes is a continuous structure and has a first end and a second end in the first direction, and each of the plurality of second touch electrodes is a continuous structure; and the plurality of first leads is located in a single layer, and the plurality of first touch electrodes is located in another single layer;

a plurality of second leads one-to-one corresponding to the plurality of first touch electrodes, wherein each of the plurality of second leads has an end that is electrically connected to both a corresponding one of the plurality of first touch electrodes and a corresponding one of the plurality of first leads, and another end that is electrically connected to a driving chip; and an insulation layer disposed between a film layer where the plurality of first leads is located and a film layer where the plurality of first touch electrodes is located, wherein in a direction perpendicular to a plane of the organic light-emitting display panel, each of the plurality of first leads at least partially covers a corresponding one of the plurality of first touch electrodes and is electrically connected to the corresponding one of the plurality of first touch electrodes through at least one corresponding through hole in the insulation layer; each of the plurality of first leads is electrically connected to the corresponding one of the plurality of first touch electrodes through the at least one corresponding through hole at a position other than the first end and the second end of the first lead and the first end and the second end of the first touch electrode, and the second end of each of the plurality of first leads and the second end of the corresponding one of the plurality of first touch electrodes are both directly connected to a corresponding second lead of the plurality of second leads that is electrically connected to the driving chip, wherein the plurality of first touch electrodes are divided into at least one type-A first touch electrode and at least one type B first touch electrode that are arranged in the second direction, the first end of each of the at least one type-A first touch electrode is electrically connected to the corresponding one second lead, and the second end of each of the at least one type-B first touch electrode is electrically connected to the corresponding one second lead, such that each of the at least one type-A first touch electrode and at least one type B first touch electrode is driven simultaneously at a position of the corresponding at least one through hole and at a position of the corresponding second lead connected thereto, and wherein the organic light-emitting display panel has a display region and a non-display region, the plurality of first leads is located in the display region, and the plurality of second leads is located in the non-display region.

2. The organic light-emitting display panel according to claim 1,
wherein in the first direction, each of the plurality of first touch electrodes and each of the plurality of first leads extends from one end of the display region to another end of the display region.

3. The organic light-emitting display panel according to claim 2, wherein
in the first direction, the non-display region comprises a first region and a second region, the first region and the second region being located at two opposite sides of the display region respectively; and each of the plurality of first touch electrodes is electrically connected to the corresponding first lead of the plurality of first leads at a position, adjacent to the first region, in the display region, and each of the plurality of first touch electrodes is electrically connected to a corresponding second lead of the plurality of second leads at a position, adjacent to the second region, in the display region.

4. The organic light-emitting display panel according to claim 2, wherein
in the first direction, the non-display region comprises a first region and a second region, the first region and the second region being located at two opposite sides of the display region respectively;
the plurality of first touch electrodes comprises a plurality of a first type of first touch electrodes and a plurality of a second type of first touch electrodes, and each of the plurality of the first type of first touch electrodes and each of the plurality of the second type of first touch electrodes are alternately arranged in the second direction;
each of the plurality of the first type of first touch electrodes is electrically connected to a corresponding first lead of the plurality of first leads at a position, adjacent to the first region, in the display region, and is electrically connected to a corresponding second lead of the plurality of second leads at a position, adjacent to the second region, in the display region; and
each of the plurality of the second type of first touch electrodes is electrically connected to a corresponding first lead of the plurality of first leads at a position, adjacent to the second region, in the display region, and is electrically connected to a corresponding second lead of the plurality of second leads at a position, adjacent to the first region, in the display region.

5. The organic light-emitting display panel according to claim 1, wherein each of the plurality of first leads is electrically connected to each corresponding first touch electrode through one of a plurality of through holes in the insulation layer, or each of the plurality of first leads is electrically connected to each corresponding first touch electrode through plural of a plurality of through holes in the insulation layer.

6. The organic light-emitting display panel of claim 1, further comprising a bridge metal layer, wherein
the bridge metal layer is located between the plurality of first leads and the plurality of first touch electrodes, or
the bridge metal layer and the plurality of first leads are arranged in a same layer, or
the bridge metal layer is located at a side of the plurality of first touch electrodes facing away from the plurality of first leads.

7. The organic light-emitting display panel according to claim 6, wherein
the bridge metal layer and the plurality of first leads are arranged in a same layer, the bridge metal layer comprises a bridge pattern, the plurality of first leads has a hollow region, and in the direction perpendicular to the plane of the organic light-emitting display panel, the bridge pattern is located within the hollow region of the plurality of first leads.

8. The organic light-emitting display panel according to claim 1, wherein
an edge of each of the plurality of first leads extending in the first direction is serrated.

9. The organic light-emitting display panel according to claim 1, wherein
the plurality of first leads is made of indium tin oxide material.

10. The organic light-emitting display panel according to claim 1, wherein
each of the plurality of first touch electrodes is a driving electrode, and each of the plurality of second touch electrodes is a sense electrode; or
each of the plurality of first touch electrodes is a sense electrode, and each of the plurality of second touch electrodes is a driving electrode.

11. The organic light-emitting display panel according to claim 1, wherein
the plurality of first touch electrodes is a metal grid or a transparent conductive layer; and
the plurality of second touch electrodes is a metal grid or a transparent conductive layer.

12. A display device, comprising an organic light-emitting display panel, wherein the organic light-emitting display panel comprises:
a plurality of first touch electrodes extending in a first direction and arranged in a second direction;
a plurality of second touch electrodes extending in the second direction and arranged in the first direction;
a plurality of first leads one-to-one corresponding to the plurality of first touch electrodes, wherein the plurality of first leads extends in the first direction and is arranged in the second direction, each of the plurality of first leads is made of a transparent conductive material, and the plurality of first leads is located above the plurality of first touch electrodes; each of the plurality of first leads is a continuous structure and has a first end and a second end in the first direction, each of the plurality of first touch electrodes is a continuous structure and has a first end and a second end in the first direction, and each of the plurality of second touch electrodes is a continuous structure; and the plurality of first leads is located in a single layer, and the plurality of first touch electrodes is located in another single layer;
a plurality of second leads one-to-one corresponding to the plurality of first touch electrodes, wherein each of the plurality of second leads has an end that is electrically connected to both a corresponding one of the plurality of first touch electrodes and a corresponding one of the plurality of first leads, and another end that is electrically connected to a driving chip; and
an insulation layer disposed between a film layer where the plurality of first leads is located and a film layer where the plurality of first touch electrodes is located,
wherein in a direction perpendicular to a plane of the organic light-emitting display panel, each of the plurality of first leads at least partially covers a corresponding one of the plurality of first touch electrodes and is electrically connected to the corresponding one of the plurality of first touch electrodes through at least one corresponding through hole in the insulation layer; each of the plurality of first leads is electrically connected to the corresponding one of the plurality of first touch electrodes through the at least one corresponding through hole at a position other than the first end and the second end of the first lead and the first end and the second end of the first touch electrode, and the second end of each of the plurality of first leads and the second end of the corresponding one of the plurality of first touch electrodes are both directly connected to a corresponding second lead of the plurality of second leads that is electrically connected to the driving chip,
wherein the plurality of first touch electrodes are divided into at least one type-A first touch electrode and at least one type B first touch electrode that are arranged in the second direction, the first end of each of the at least one type-A first touch electrode is electrically connected to the corresponding one second lead, and the second end of each of the at least one type-B first touch electrode is electrically connected to the corresponding one second lead, such that each of the at least one type-A first touch electrode and at least one type B first touch electrode is driven simultaneously at a position of the corresponding at least one through hole and at a position of the corresponding second lead connected thereto, and
wherein the organic light-emitting display panel has a display region and a non-display region, the plurality of first leads is located in the display region, and the plurality of second leads is located in the non-display region.

\* \* \* \* \*